United States Patent
Chung

(10) Patent No.: US 7,936,046 B2
(45) Date of Patent: *May 3, 2011

(54) INTEGRATED CIRCUIT DEVICES INCLUDING PASSIVE DEVICE SHIELDING STRUCTURES

(75) Inventor: Chulho Chung, Gyeonggi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/830,627

(22) Filed: Jul. 6, 2010

(65) Prior Publication Data

US 2010/0264513 A1   Oct. 21, 2010

Related U.S. Application Data

(60) Continuation of application No. 12/630,236, filed on Dec. 3, 2009, now Pat. No. 7,777,299, which is a division of application No. 11/042,007, filed on Jan. 25, 2005, now Pat. No. 7,663,205.

(30) Foreign Application Priority Data

Aug. 3, 2004 (KR) .................. 10-2004-0061159

(51) Int. Cl.
   *H01L 27/08* (2006.01)
(52) U.S. Cl. ............ 257/531; 257/533; 257/E21.022
(58) Field of Classification Search ........... 257/347, 257/531–533, E21.022
   See application file for complete search history.

(56) References Cited

U.S. PATENT DOCUMENTS

| | | | |
|---|---|---|---|
| 5,773,892 A * | 6/1998 | Morikawa et al. ............ | 257/758 |
| 5,805,043 A * | 9/1998 | Bahl ........................ | 336/200 |
| 6,437,409 B2 | 8/2002 | Fujii .......................... | 257/379 |
| 6,452,249 B1 | 9/2002 | Maeda et al. ................ | 257/531 |
| 6,593,838 B2 | 7/2003 | Yue ............................. | 336/84 |
| 6,777,774 B2 | 8/2004 | Beng et al. .................. | 257/531 |
| 6,798,039 B1 | 9/2004 | Gillespie et al. ............. | 257/531 |
| 7,183,624 B2 | 2/2007 | Ipposhi ....................... | 257/531 |
| 7,663,205 B2 * | 2/2010 | Chung ........................ | 257/531 |
| 2001/0013626 A1 | 8/2001 | Fujii | |
| 2002/0109204 A1 | 8/2002 | Acosta et al. | |
| 2002/0190349 A1 | 12/2002 | Maeda et al. ................ | 257/531 |
| 2003/0122648 A1 | 7/2003 | Ou et al. | |
| 2004/0007760 A1 | 1/2004 | Lowther ...................... | 257/531 |

FOREIGN PATENT DOCUMENTS

WO   WO 98/50956 A1   11/1998

OTHER PUBLICATIONS

Office Action for corresponding German Application No. 10 2005 038 526.5-33 dated Feb. 24, 2010. Office Action for German patent application 10 2005 038 526.5-33; dated Dec. 6, 2006.

Tiemeijer et al. "Record O Symmetrical Inductors for 10-GHz LC-VCOs in 0.1 8-•m Gate-Length CMOS" *IEEE Electron Device Letters* 23(12):713-715 (2002).

* cited by examiner

*Primary Examiner* — Brook Kebede
(74) *Attorney, Agent, or Firm* — Myers Bigel Sibley & Sajovec

(57) ABSTRACT

Integrated circuit devices include a semiconductor substrate and a flux line generating passive electronic element on the semiconductor substrate. A dummy gate structure is arranged on the semiconductor substrate in a region below the passive electronic element. The dummy gate includes a plurality of segments, each segment including a first longitudinally extending part and a second longitudinally extending part. The second longitudinally extending part extends at an angle from an end of the first longitudinally extending part. Ones of the segments extend at a substantially same angle and are arranged displaced from each other in an adjacent nested relationship.

16 Claims, 10 Drawing Sheets

US 7,936,046 B2

INTEGRATED CIRCUIT DEVICES INCLUDING PASSIVE DEVICE SHIELDING STRUCTURES

CROSS-REFERENCE TO RELATED APPLICATION

This application is a continuation application of U.S. patent application Ser. No. 12/630,236 filed Dec. 3, 2009, now U.S. Pat. No. 7,777,299 which is divisional application of U.S. patent application Ser. No. 11/042,007 filed Jan. 25, 2005, now issued U.S. Pat. No. 7,663,205 which is related to and claims priority from Korean Patent Application No. 10-2004-61159, filed on Aug. 3, 2004, the disclosures of which are hereby incorporated herein by reference in their entirety.

BACKGROUND OF THE INVENTION

The present invention relates to integrated circuit devices and, more particularly, to integrated circuit devices having passive devices thereon and methods of forming the same.

Integrated circuit devices are being introduced into a variety of different electronic products in place of discrete circuits as they may reduce the cost and the size and/or package complexity of the electronic circuitry included in such devices. Such integrated circuit devices, in some instances, may be referred to as system-on-chip (SOC) devices. Various commercial products in which such integrated circuit devices are being incorporated operate at the radio frequency (RF) band, such as wireless communication devices. In such devices, passive electronic components, such as an inductor or capacitor, are generally essential elements in analog circuitry and/or radio frequency circuits incorporated in the integrated circuit devices. The Quality factor (Q) is a commonly used indicator of performance of an inductor in an integrated circuit device. Q is a measurement of the relationship between power loss and energy storage in an inductor as expressed by the following equation:

$$Q = \frac{\omega * \text{Maximum energy stored per cycle}}{\text{Average power dissipated per cycle}} \quad (1)$$

where ω is the angular frequency and Q is the quality factor.

In operation, devices such as inductors generate magnetic fields. Various effects, such as eddy currents, may arise due to the presence of such magnetic fields passing into the integrated circuit device, which may reduce Q for the inductor. Various such effects are illustrated schematically in the perspective views of the FIGS. 1A and 1B. As shown in FIGS. 1A and 1B, an integrated circuit (semiconductor) substrate 10 has an interlayer dielectric layer 40 thereon and an inductor 50 on a top surface of the interlayer dielectric layer 40. The inductor 50 generates a magnetic field 60 that passes into the substrate 10 and the interlayer dielectric layer 40. Furthermore, the magnetic field 60 generates eddy currents 70 in the integrated circuit substrate 10. In addition to the undesirable eddy currents 70, the inductor 50 may also create problems related to substrate noise coupling and a parasitic capacitance may be established between the inductor 50 and a shield pattern 20 formed in the interlayer dielectric layer 40 between the integrated circuit substrate 10 and the inductor 50.

SUMMARY OF THE INVENTION

Embodiments of the present invention provide integrated circuit devices including a semiconductor substrate and a flux line generating passive electronic element on the semiconductor substrate. A dummy gate structure is arranged on the semiconductor substrate in a region below the passive electronic element. The dummy gate includes a plurality of segments, each segment including a first longitudinally extending part and a second longitudinally extending part. The second longitudinally extending part extends at an angle from an end of the first longitudinally extending part. Ones of the segments extend at a substantially same angle and are arranged displaced from each other in an adjacent nested relationship.

In further embodiments of the present invention, the dummy gate structure is configured to inhibit penetration into the semiconductor substrate of flux lines generated by the passive electronic element. The passive electronic element may be an inductor and at least half of the segments may extend in a direction orthogonal to a corresponding overlying portion of the inductor. The passive element may be a capacitor. The dummy gate structure may include a plurality of sets of the segments arranged in a symmetrical pattern.

In other embodiments of the present invention, a plurality of isolation regions are located in the region below the passive electronic element and the dummy gate structure segments are positioned on the isolation regions to define a first shield. A plurality of conductive regions may also be located between the isolation regions that are configured to define a complementary second shield. The conductive regions may be a metal silicide pattern on the semiconductor substrate. An interlayer dielectric layer may be provided on the semiconductor substrate extending over the dummy gate structure and the conductive regions and the passive electronic element may be positioned on the interlayer dielectric layer.

In further embodiments of the present invention, a conductive screen extends into the interlayer dielectric region around the passive electronic element and defines a perimeter surrounding the passive electronic element. The conductive screen is configured to limit penetration of flux lines generated by the passive electronic element past the perimeter. The conductive screen may include a plurality of columns of conductive elements extending into the interlayer dielectric layer along the perimeter, the columns being displaced from each other and each of the columns including a plurality of electrically coupled conductive elements displaced from each other. A complementary conductive screen may also be provided extending into the interlayer dielectric region around the passive electronic element and defining a second perimeter surrounding the passive electronic element adjacent and displaced from the first conductive screen. The complementary conductive screen may be configured to limit penetration of flux lines generated by the passive electronic element past the perimeter. The complementary conductive screen may have a plurality of columns aligned with spaces between columns of the first conductive screen.

In further embodiments of the present invention, the region below the passive electronic element is a passive region of the integrated circuit device and the integrated circuit device further includes an active region on the semiconductor substrate proximate to the passive region and outside the perimeter. The active region includes active device gate electrodes formed while forming the plurality of dummy gate electrodes. In other embodiments, the active device gate electrodes are formed on a same layer of the integrated circuit device as the dummy gate structure.

In yet other embodiments of the present invention, the dummy gate structure includes a gate insulating layer on the semiconductor substrate and a conductive gate electrode on the gate insulating layer. The dummy gate structure may further include a silicide layer on the gate electrode and insulative sidewalls on sides of the gate insulating layer, gate electrode and silicide layer.

In further embodiments of the present invention, the interlayer dielectric layer includes a first and a second interlayer dielectric layer and the first interlayer dielectric region is formed on the dummy gate electrode and the plurality of conductive regions are formed on the first interlayer dielectric layer and the second interlayer dielectric layer is formed on the plurality of conductive regions. A metal contact may be coupled to the dummy gate structure in a central region thereof under the passive electronic element, the metal contact connecting the dummy gate structure to ground. A metal contact may also be provided coupled to the plurality of conductive regions in a central region thereof under the passive electronic element, the metal contact to the plurality of conductive regions connecting the plurality of conductive regions to ground.

In other embodiments of the present invention, integrated circuit devices on a semiconductor substrate include a flux line generating passive electronic element on the semiconductor substrate. A dummy gate structure is arranged on the semiconductor substrate in a region below the passive electronic element, the dummy gate structure being arranged to inhibit penetration into the semiconductor substrate of flux lines generated by the passive electronic element. A metal contact is coupled to the dummy gate structure in a central region thereof under the passive electronic element, the metal contact connecting the dummy gate structure to ground.

In further embodiments of the present invention, integrated circuit devices on a semiconductor substrate include a first interlayer dielectric layer on the semiconductor substrate, a second interlayer dielectric layer on the first interlayer dielectric layer and a third interlayer dielectric layer on the second interlayer dielectric layer. A flux line generating passive electronic element is on the third interlayer dielectric layer. A first grounded conductive shield pattern is on the first interlayer dielectric layer in a region below the passive electronic element and a second grounded conductive shield pattern is on the second interlayer dielectric layer in the region below the passive electronic element. The first and second grounded conductive shield may be metal.

In yet other embodiments of the present invention, integrated circuit devices on a semiconductor substrate include a flux line generating passive electronic element on the semiconductor substrate. An isolation region is provided having a plurality of segments in the semiconductor substrate below the passive electronic element defining a first shield pattern that is configured to inhibit penetration into the semiconductor substrate of flux lines generated by the passive electronic element. A plurality of conductive elements are positioned between ones of the isolation regions to define a complementary second conductive shield pattern that is configured to inhibit penetration into the semiconductor substrate of flux lines generated by the passive electronic element. The plurality of conductive elements may be a dummy gate structure or may be a metal silicide pattern.

In further embodiments of the present invention, integrated circuit devices on a semiconductor substrate include a flux line generating capacitor on the semiconductor substrate. A dummy gate structure is arranged on the semiconductor substrate in a region below the passive electronic element, the dummy gate structure being arranged to inhibit penetration into the semiconductor substrate of flux lines generated by the capacitor.

In other embodiments of the present invention, methods of forming an integrated circuit device include forming an active device and a passive device region in a semiconductor substrate. A gate electrode of an active device in the active device region and a dummy gate electrode in the passive device region are concurrently formed. A first interlayer dielectric layer is formed on the gate electrode and the dummy gate electrode. A metal plug is formed extending through the first interlayer dielectric layer and contacting the dummy gate electrode at a central region thereof. A metal layer pattern is formed contacting the metal plug to connect the dummy gate electrode to ground. A second interlayer dielectric layer is formed on the metal layer pattern and a flux line generating passive electronic element is formed on the interlayer dielectric layer over the dummy gate electrode.

In yet further embodiments of the present invention, methods of forming an integrated circuit device include forming an active device and a passive device region in a semiconductor substrate. A gate electrode of an active device in the active device region and a dummy gate electrode structure on the passive device region are concurrently formed. The dummy gate electrode structure includes a plurality of segments, each segment including a first longitudinally extending part and a second longitudinally extending part. The second longitudinally extending part extends at an angle from an end of the first longitudinally extending part and ones of the segments extend at a substantially same angle and are arranged displaced from each other in an adjacent nested relationship. An interlayer dielectric layer is formed on the gate electrode and the dummy gate electrode structure and a flux line generating passive electronic element is formed on the interlayer dielectric layer over the dummy gate electrode structure.

In other embodiments of the present invention, integrated circuit devices on a semiconductor substrate include a flux line generating passive electronic element on the semiconductor substrate. A three dimensional electromagnetic shield is disposed around the passive electronic element and between the passive electronic element and the semiconductor substrate. The electromagnetic shield is configured to inhibit penetration into the semiconductor substrate of flux lines emanating from the passive electronic element and to inhibit escape of flux lines emanating from the passive electronic element from a perimeter surrounding the passive electronic element. The three dimensional electromagnetic shield may include a dummy gate structure arranged on the semiconductor substrate in a region below the passive electronic element. The three dimensional electromagnetic shield may further include a conductive screen extending into the interlayer dielectric region around the passive electronic element and defining a perimeter surrounding the passive electronic element. The conductive screen may be configured to limit penetration of flux lines generated by the passive electronic element past the perimeter.

In further embodiments of the present invention, integrated circuit devices on a semiconductor substrate include a flux line generating passive electronic element on the semiconductor substrate. A plurality of dummy gate structures are arranged on the semiconductor substrate in a region below the passive electronic element. The plurality of dummy gate structures are displaced from each other and are arranged to inhibit penetration into the semiconductor substrate of flux lines generated by the passive electronic element. An interlayer dielectric layer may be provided on the plurality of dummy gate structures and a metal layer coupled to ground may be provided on the interlayer dielectric layer. In such embodiments, a plurality of conductive contacts extend from the metal layer to the plurality of dummy gate structures to couple the plurality of dummy gate structures to ground through the metal layer.

In yet other embodiments of the present invention, integrated circuit devices on a semiconductor substrate include a first interlayer dielectric layer on the semiconductor substrate, a second interlayer dielectric layer on the first interlayer dielectric layer and a third interlayer dielectric layer on the second interlayer dielectric layer. A flux line generating passive electronic element is on the third interlayer dielectric layer. A first metal conductive shield pattern is on the first interlayer dielectric layer in a region below the passive electronic element and a second metal conductive shield pattern is on the second interlayer dielectric layer in the region below the passive electronic element.

BRIEF DESCRIPTION OF THE DRAWINGS

The present invention will now be described with reference exemplary embodiments illustrated in the attached drawings in which.

DETAILED DESCRIPTION OF THE INVENTION

Figure 1A:
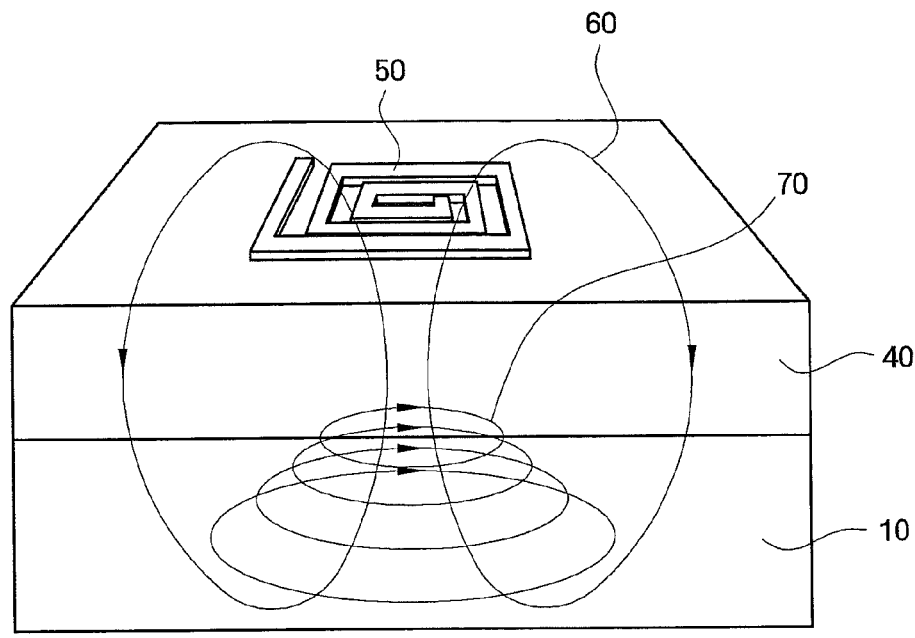
FIG. 1A is a perspective view illustrating magnetic fields and eddy currents in an integrated circuit device.
Figure 1B:
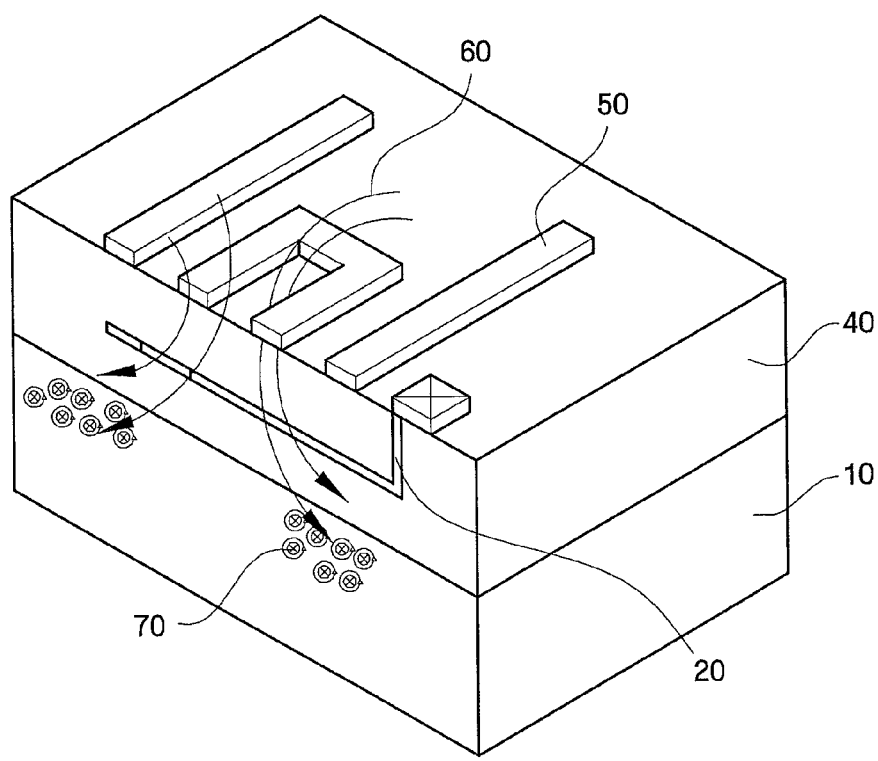
FIG. 1B is a perspective view illustrating magnetic fields and eddy currents in an integrated circuit device.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Figure 2:
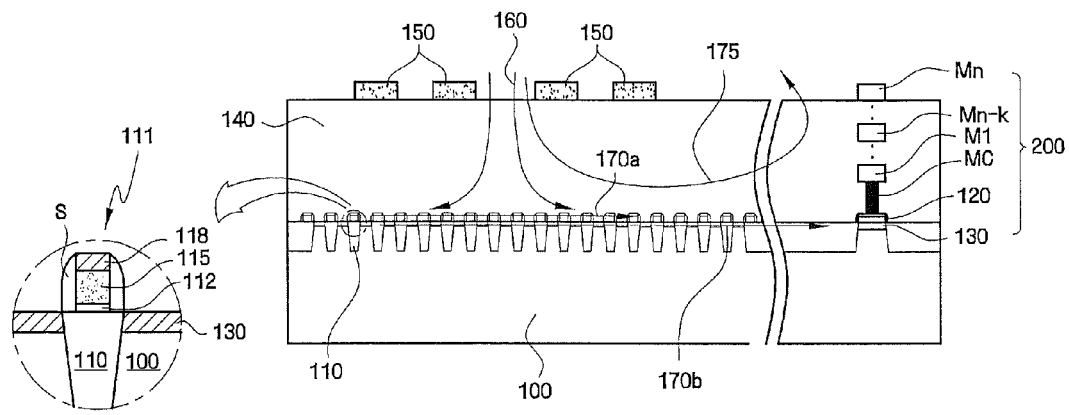
FIG. 2 is a cross-sectional view illustrating an integrated circuit device including passive device shielding according to some embodiments of the present invention.

Various embodiments of the present invention will now be described with reference to FIGS. 2-5. FIG. 2 is a cross sectional view illustrating an integrated circuit (semiconductor) device including passive device shield according to some embodiments of the present invention. As illustrated in the embodiments of FIG. 2, an integrated circuit substrate 100 includes trench isolation regions 110 with a dummy gate structure 111 arranged thereon. The dummy gate structure 111 shown in the embodiments of FIG. 2 includes a gate insulating layer 112 and a conductive gate electrode shown as a polysilicon layer 115 and a silicide layer 118 on the polysilicon layer 115. Also shown in the dummy gate structure 111 of FIG. 2 are insulative sidewalls S on sides of the gate insulating layer 112, polysilicon layer 115 and silicide layer 118.

The dummy gate structure 111 is arranged on the integrated circuit substrate 100 in a region below the passive electronic element, shown as an inductor 150 in FIG. 2. The dummy gate structure 111 defines a first shield pattern configured to inhibit penetration into the integrated circuit substrate 100 of flux lines 160 generated by the inductor 150. As shown schematically in FIG. 2, the flux lines 160 caused by a magnetic field from the inductor 150 may cause an eddy current 170A, 170B that may degrade the performance of the inductor 150 and may further flow into adjacent devices in other regions of the integrated circuit substrate 100. The eddy current 170A, 170B may be reduced or even eliminated due to shielding structures as provided by various embodiments of the present invention.

A plurality of conductive regions 130 are provided between portions of the isolation region 110. The conductive regions 130 are configured to define a complimentary second shield. For example, the conductive regions 130 may be a metal silicide. The metal in the metal silicide may be cobalt, nickel, tungsten and/or titanium or the like. As shown in the embodiments of FIG. 2, an interlayer dielectric layer 140 is positioned on the integrated circuit substrate 100 extending over the dummy gate structure 111 and the conductive regions 130 with the inductor 150 positioned on the interlayer dielectric layer 140.

Also shown in the embodiments of FIG. 2 is a conductive screen 200 extending into the interlayer dielectric region 140 around the inductor 150 to further define a perimeter around the inductor 150. The conductive screen 200 is configured to limit penetration of flux lines 175 generated by the inductor 150 past the perimeter defined by the conductive screen 200. The conductive screen 200 may be provided by a variety of metal layer patterns M1-Mn formed on the integrated circuit substrate 100 with interlayer dielectric layers therebetween. Accordingly, the interlayer dielectric layer 140 illustrated in FIG. 2 may be a plurality of interlayer dielectric layers formed with metal layer patterns therebetween. The top metal layer Mn defining the upper most layer of the conductive screen 200 may be formed of the same metal layer as the inductor 150.

Figure 3:
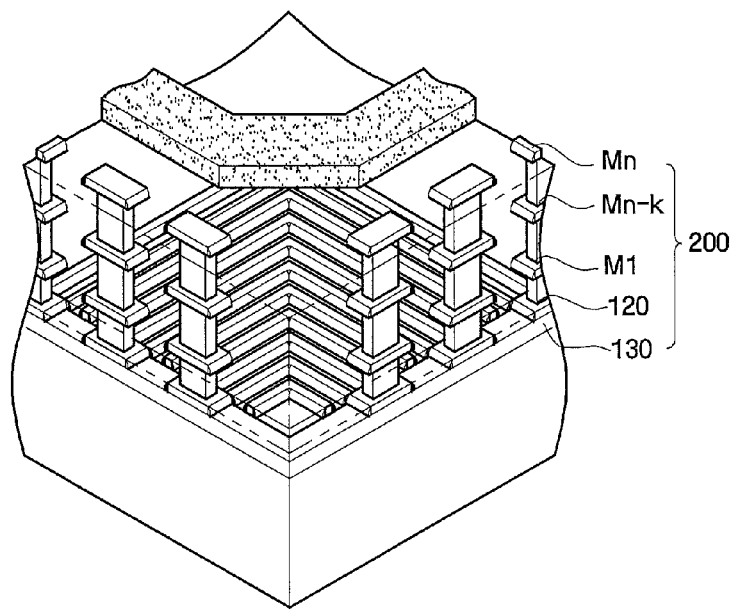
FIG. 3 is a cross-sectioned perspective view illustrating portions of the device of FIG. 2.

As best seen in the cross-sectioned perspective view of FIG. 3 illustrating portions of the device of FIG. 2, the conductive screen 200 may include a plurality of columns of conductive elements extending into the interlayer dielectric layer 140 along the perimeter. The columns are shown displaced from each other and each of the columns includes a plurality of conductive elements (M1-Mn) displaced from each other. As seen in FIGS. 2 and 3, the respective columns of conductive elements may be electrically coupled conductive elements as shown by the illustrative metal contact MC. It will be understood that metal contacts MC may be provided between other ones of the metal conductive elements Mn-k through Mn of each column of the conductive screen, all of which may be grounded through a metal contact 120 which, in turn, may contact a conductive region 130 formed with and coupled to the conductive regions 130 defining the complimentary shield pattern 130. The conductive screen 200 in combination with the shield pattern 120 and the complimentary shield pattern 130 may define a first perimeter surrounding the inductor 150.

Figure 4:
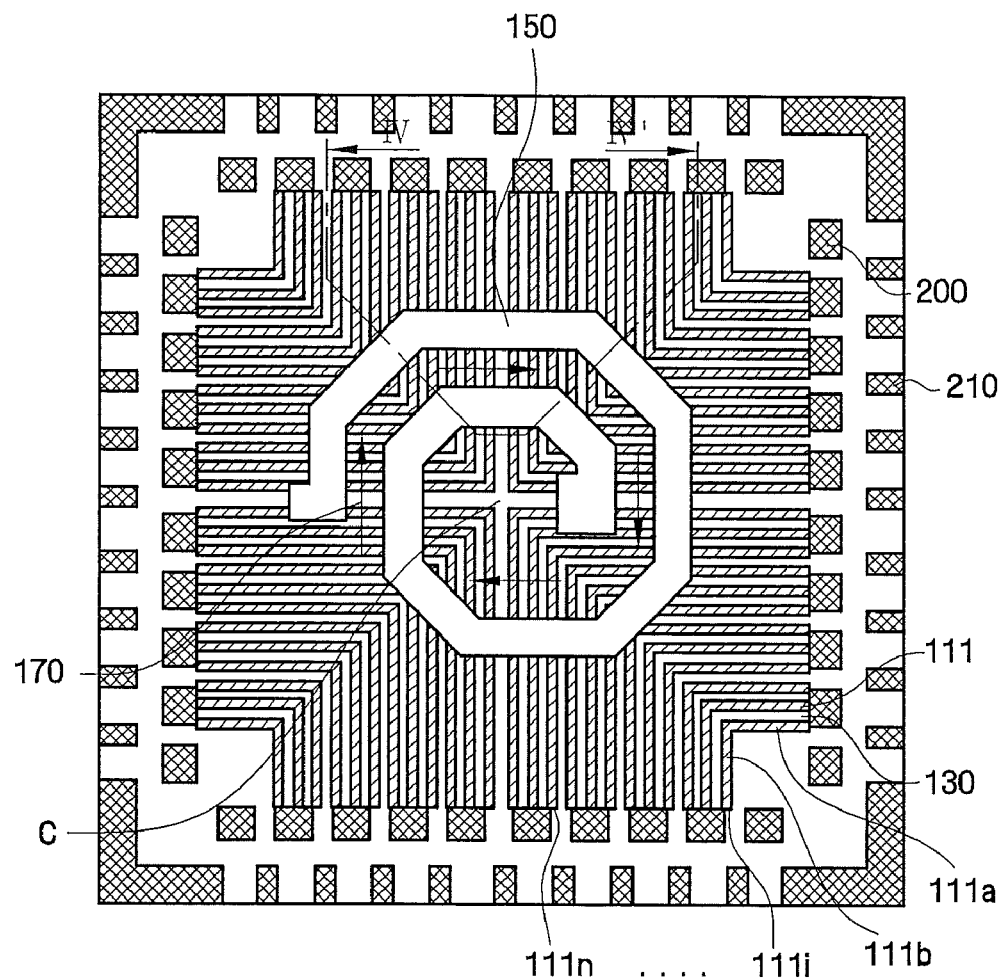
FIG. 4 is a top planar view of the device of FIG. 2.

FIG. 4 is a top planer view of the device of FIG. 2 and FIG. 3 illustrating further aspects of some embodiments of the present invention. As shown in FIG. 4, a complimentary conductive screen 210 may be provided in some embodiments of the present invention. The complimentary conductive screen 210 extends into the interlayer dielectric region 140 around the inductor 150 and defines a second perimeter surrounding the inductor 150 adjacent to and displaced from the first conductive screen 200. The columns of conductive elements of the complimentary conductive screen 210, as seen in FIG. 4, are offset from (i.e. complimentary to) those of the first conductive screen 200. The complimentary conductive screen 210 is likewise configured to limit penetration of flux lines generated by the inductor 150 past the second perimeter to limit the escape of flux lines beyond the perimeter from the conductor 150 or other passive element contained within the perimeter defined by the complimentary conducive screen).

FIG. 4 further illustrates various aspects of the pattern of the dummy gate structure 111. In particular, as seen in the top plane view of FIG. 4, the dummy gate structure 111 includes a plurality of segments 111i-n. Each of the segments 111i-111n includes a first longitudinally extending part 111a and a second longitudinally extending part 111b. The second longitudinally extending part 111b extends at an angle from an end of the first longitudinally extend part 111a. As also seen in FIG. 4, the respective parts 111a, 111b in each of the segments 111i-111n extend at an substantially same angle and are arranged displaced from each other in an adjacent nested relationship with the conductive regions 130 therebetween. As also seen by the arrangement of the respective segments 111i, 111n relative to the inductor 150, at least half of the segments 111i through 111n extend in a direction substantially orthogonal to a corresponding overlying portion of the inductor 150. Such a respective orthogonal relationship may improve the effectiveness of shielding provided by the shields 111, 130.

As also shown by FIG. 4, the dummy gate structure may include a plurality of sets of the segments 111i through 111n arranged in a symmetrical pattern. In particular, as shown in FIG. 4, a four set pattern is provided with each quadrant of the region below the inductor 150 including one set and with the four quadrants arranged in a symmetrical pattern.

As described above, in various embodiments of the present invention, a plurality of dummy gate structures may be provided arranged on the integrated circuit (semiconductor) substrate 100 in a region below a passive electronic element, such as the inductor 150, with the dummy gate structures being displaced from each other and arranged to inhibit penetration into the semiconductor substrate 100 of flux lines generated by the inductor 150. Furthermore, the dummy gate structure defined shield and the conductive screen 200, and, in some embodiments, the complimentary shield pattern 130 and the complimentary conductive screen 210, may provide a three dimensional electromagnetic shield disposed around the inductor 150 and between the inductor 150 and the substrate 100. The electromagnetic shield may be configured to inhibit penetration into the semiconductor substrate 100 of flux lines emanating from the inductor 150 and to prohibit escape of the flux lines emanating from the inductor 150 through a perimeter surrounding the inductor 150. As will be further described with reference to FIG. 5, a metal contact may be coupled to the dummy gate structure 111 in a central region thereof under the inductor 150 that connects the dummy gate structure 111 to ground.

Figure 5:
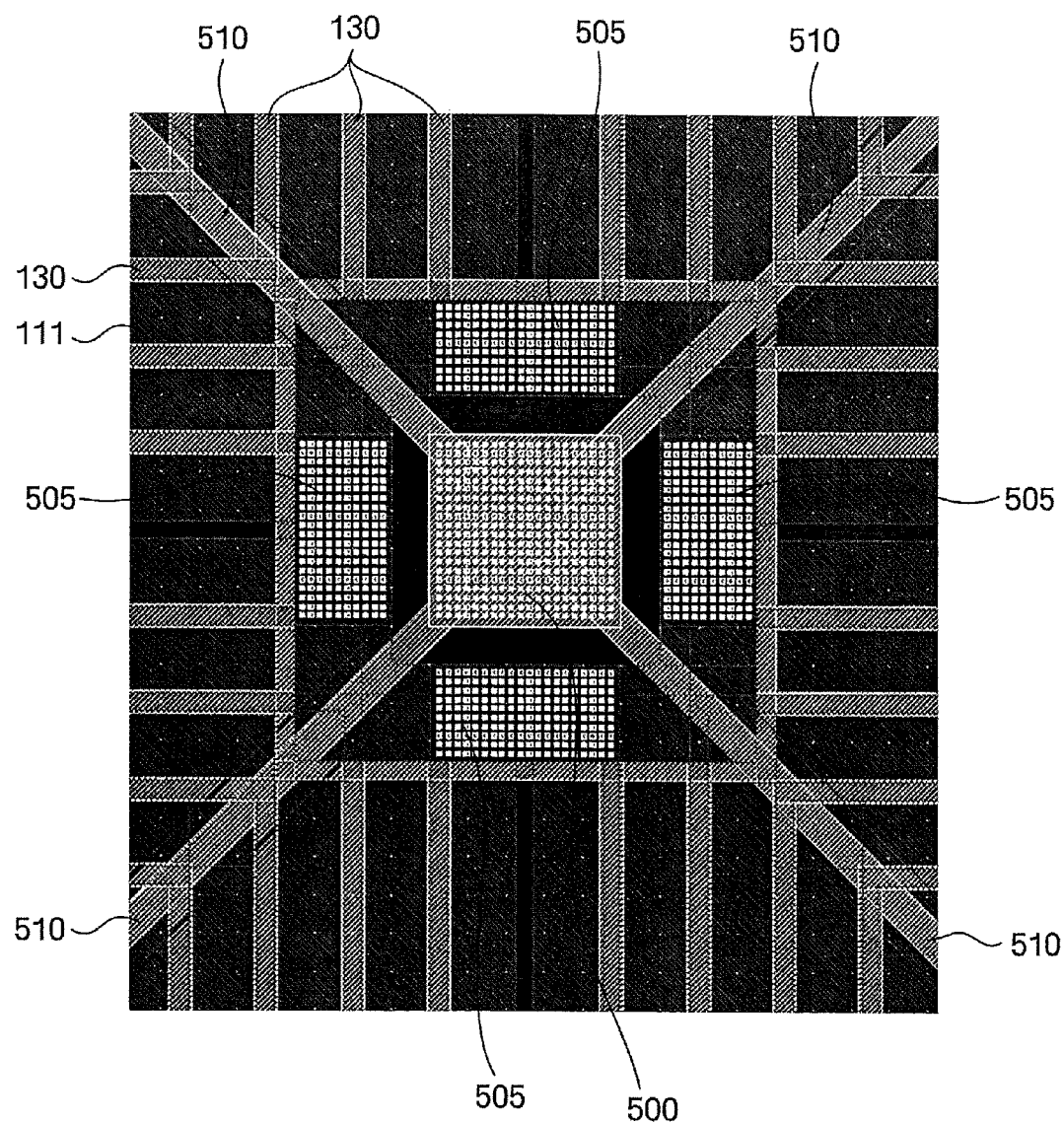
FIG. 5 is a top planar view of conductive contacts to ground in a device shielding structure according to some embodiments of the present invention.

FIG. 5 is a top planer view of a conductive contact arrangement for a grounded device shielding structure according to some embodiments of the present invention. It will be understood that the view of FIG. 5 captures a region adjacent the center region C as shown in FIG. 4. With the illustrated arrangement of the embodiments of FIG. 5, a centrally located contact may be provided to the dummy gates 111 defining the first shield pattern through centrally located metal contacts 505 and a central contact to the conductive regions 130 may be provided using metal contact 500 and the angled connection lines 510. Offset angled connection lines may also be provided for connecting the dummy gates 111 to the respective contact pads 505. Similarly, as each shield structure may be grounded, a common contact point in a central region for grounding the shield structures may be provided rather than separate structures.

A central layout of the metal contact may be beneficial as it may provide a best grounding contact in the central or highest field strength region of a flux line generating passive electronic element, such as the inductor 150. The angled connection lines 510 may be utilized to get improved or more effective grounding contact to each of the segments of the dummy gate structure 111 that are displaced from each other in the symmetrical arrangement seen in FIG. 4 and, likewise, to each of the conductive regions 130 defining a complimentary shield pattern therebetween. Improved shielding performance may be provided by connecting all of the dummy gate structure 111 segments and/or all of the conductive regions 130 to ground, and centrally locating the connection to ground may provide even further benefits in shielding. Thus, a metal contact 500, 505 may be coupled to the segments of the dummy gate structure 111 and/or the conductive regions 130 in a central region C thereof under the inductor 150 to connect the segments of the dummy gate structure 111 and/or the conductive regions 130 to ground. A metal or other conductive layer connected to ground may overly the dummy gate structure 111 and the conductive regions 130 and a plurality of conductive contacts may extend from the metal layer to the dummy gate structure 111 and/or conductive regions 130 and/or to the metal contact 500, 505 regions to ground them through the metal layer.

Figure 6:
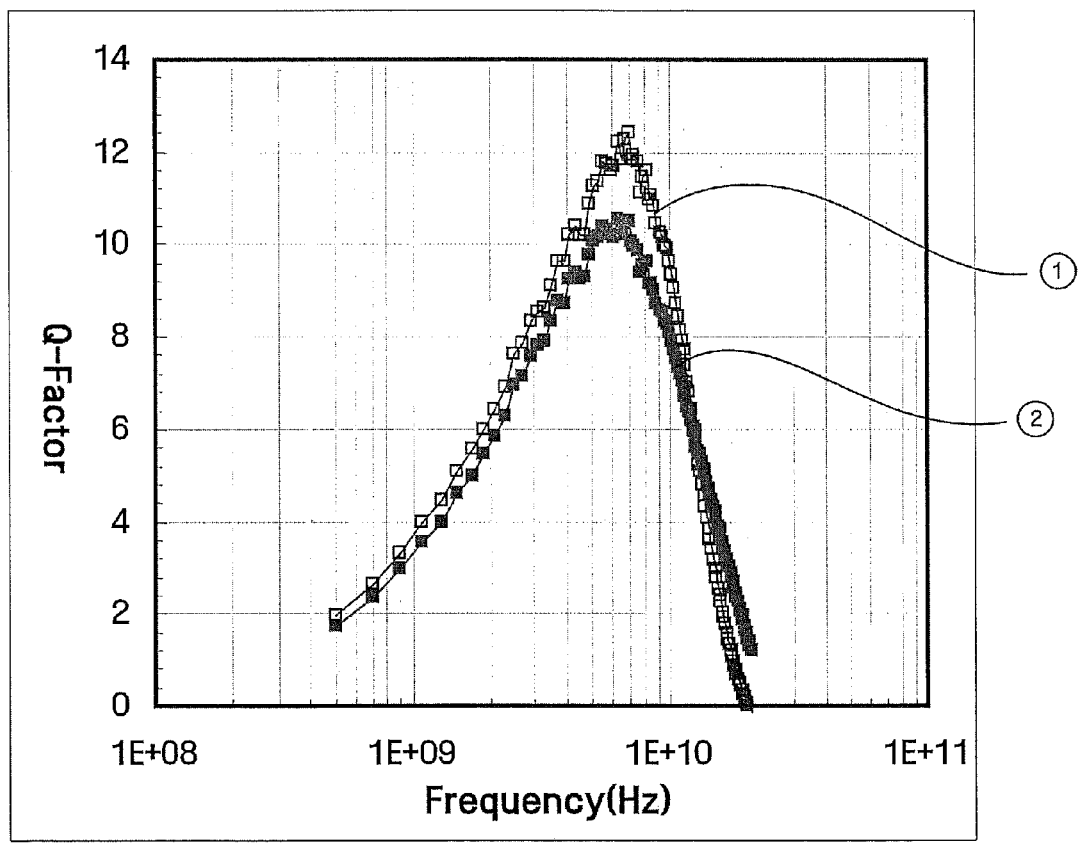
FIG. 6 is a graph illustrating Q-factor for an integrated circuit device according to some embodiments of the present invention.

FIG. 6 is a graph illustrating quality factor (Q) for an integrated circuit device according to some embodiments of the present invention as described with reference to FIGS. 2-5. FIG. 6 includes results for quality factor versus frequency for the embodiments illustrated in FIGS. 2-5 (the curve designated 1 in FIG. 6) as compared to a conventional structure (the curve designated 2 in FIG. 6). Such data results may be provided, for example, through measurements by a Network Analyzer 8510C available from Agilent Corporation, at approximately 0.5 GHz through approximately 40.5 GHz. As seen in FIG. 6, approximately a fourteen percent improvement in quality factor (Q) may be provided in various embodiments of the present invention.

Figure 7:
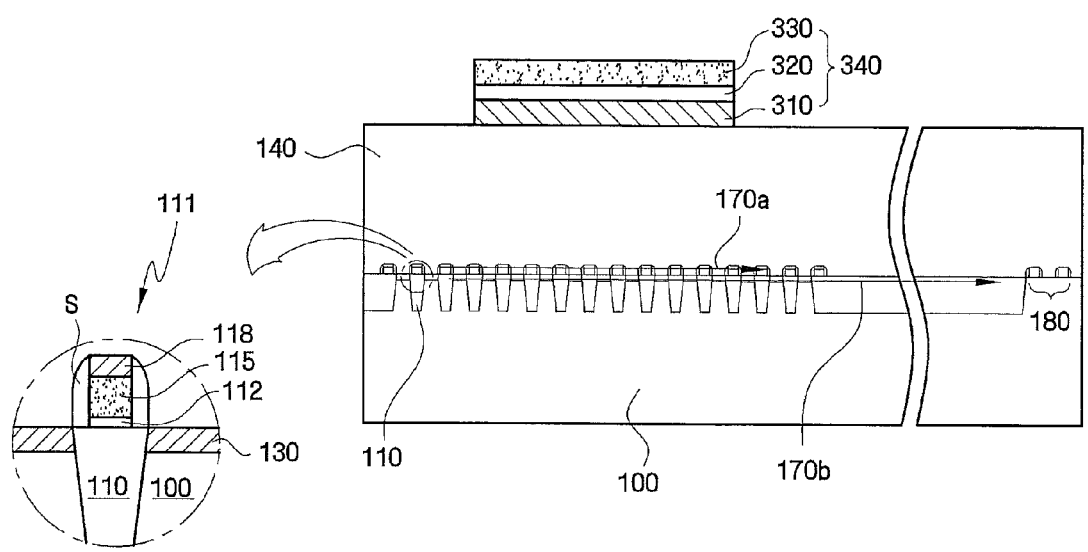
FIG. 7 is a cross-sectional view illustrating an integrated circuit device including passive device shielding according to further embodiments of the present invention.

Further embodiments of the present invention are shown in FIG. 7. As described previously with reference to FIG. 2, the embodiments illustrated in FIG. 7 include a first shield pattern defined by a dummy gate structure (pattern) 111 that may be disposed on isolation regions 110 in a semiconductor substrate 100. The dummy gate structure 111 in FIG. 7 includes a gate insulating layer 112 on the semiconductor substrate 100, more particularly, in an isolation region 110 in the semiconductor region substrate 100, and a conductive gate electrode on the gate insulating layer 112 that includes a polysilicon layer 115 and a silicide layer 118. In addition, insulated side walls S are shown on sides of the gate insulating layer 112, the polysilicon gate electrode layer 115 and the silicide layer 118. As also described with reference to FIG. 2, conductive regions 130 are shown provided between the isolation regions 110 to define a complimentary second shield. The dummy gate electrode structure 111 and conductive regions 130 may suppress or eliminate eddy currents, such as eddy currents 170A and 170B shown in FIG. 7.

The flux line generating passive electronic element illustrated for the embodiments of FIG. 7 is a capacitor 340. The capacitor 340 includes a lower electrode 310, a dielectric layer 320 and an upper electrode 310 on the dielectric layer 320. The capacitor 340 is positioned on the interlayer dielectric layer 140 over the semiconductor substrate 100 in the region including the dummy gate structure 111 and the conductive regions 130. While not shown in FIG. 7, it will be understood that a conductive screen 200 and/or complimentary conductive screen 210 may also be utilized with the embodiments illustrated in FIG. 7.

FIG. 7 further illustrates aspects of the integrated circuit device related to regions of the substrate remote from the passive electronic element 340. In particular, the region below the passive element capacitor 340 is a passive region of an integrated circuit device formed on the substrate 100, which device further includes an active region shown on the right side of FIG. 7 proximate the passive region including the capacitor 340 and outside the perimeter defined by a first and/or second shield and/or any conductive screen(s) combined therewith. The active region, as shown in FIG. 7, may include active device gate electrodes 140 that may be formed while forming the plurality of dummy gate electrode structures 111. As shown in FIG. 7, the active device gate electrodes 180 are formed on the same layer of the integrated circuit device of FIG. 7 as the dummy gate electrode structure 111. It will be further understood that, while the active region including the active device gate electrodes 180 is not shown in FIG. 2, such active regions may also be utilized in connection with the embodiments shown in FIG. 2.

Figure 8:
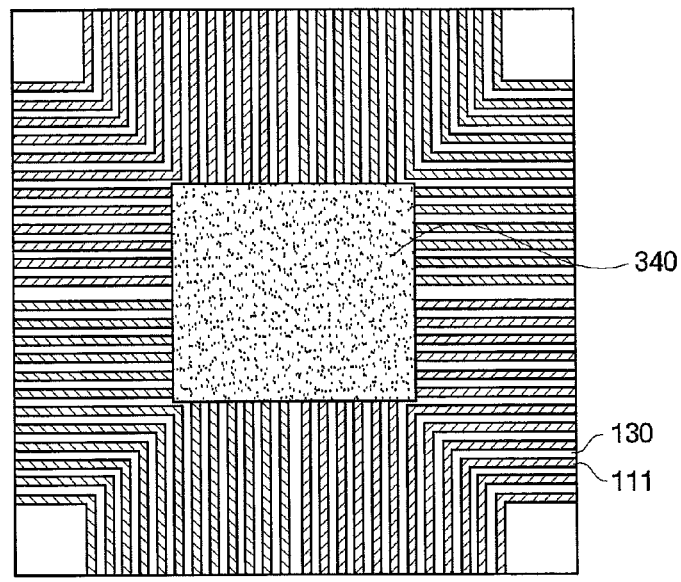
FIG. 8 is a top planar view of the device of FIG. 7.

FIG. 8 is a top planer view of the device illustrated in FIG. 7. As seen in FIG. 8, the dummy gate structure 111 and the conductive regions 130 may have an arrangement similar to that described previously with reference to FIG. 4 positioned in a region under the capacitor 340. As with FIG. 7, while the conductive screen and complimentary conductive screen 200, 210 are not shown in FIG. 8, they may be included in embodiments of the present invention including a capacitor 340 as shown in FIG. 8.

Figure 9:
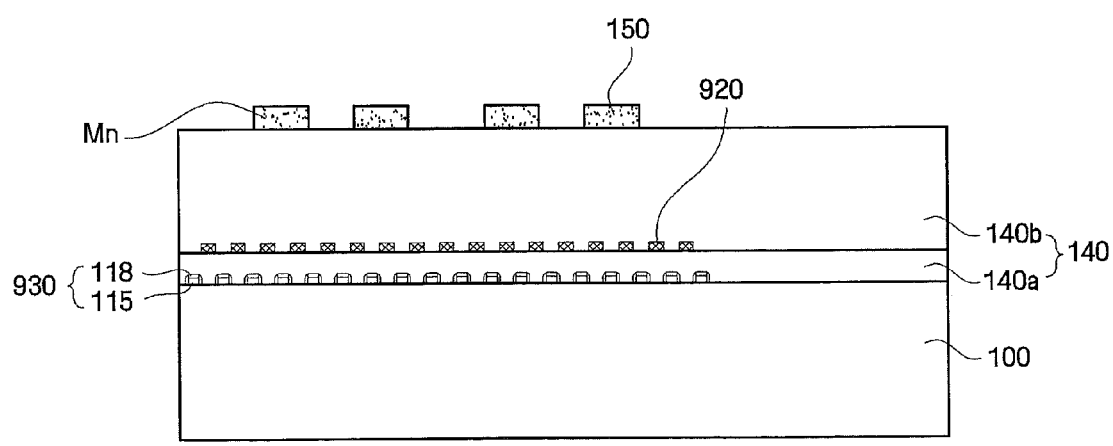
FIG. 9 is a cross-sectional view illustrating an integrated circuit device including passive device shielding according to yet further embodiments of the present invention.

Further embodiments of the present invention will now be described with reference to FIG. 9. As shown in the embodiments of FIG. 9, a shield pattern, shown as a dummy gate structure 930, is arranged on a semiconductor substrate 100 in a region under a passive electronic element, shown as an inductor 150, formed by a metal layer Mn in FIG. 9. The dummy gate structure 930 generally includes a polysilicon layer 115 and a silicide layer 118 forming a gate electrode with sidewalls formed thereon. The interlayer dielectric layer 140 includes a first interlayer dielectric layer 140A formed on the dummy gate structure 930. A plurality of conductive regions 920 defining a second shield pattern are formed on the first interlayer dielectric layer 140A. A second interlayer dielectric layer 140B is formed on the first interlayer dielectric layer 140A and the conductive regions 920. The inductor 150 is formed on the second interlayer dielectric layer 140B. As more particularly seen in FIG. 9, the dummy gate structure 930 is arranged to position the dummy gates between ones of the conductive regions 920 to define a complimentary shield structure positioned under the inductor 150. As described with previous embodiments, the complimentary shield patterns 920, 930 may each be grounded.

Figure 10:
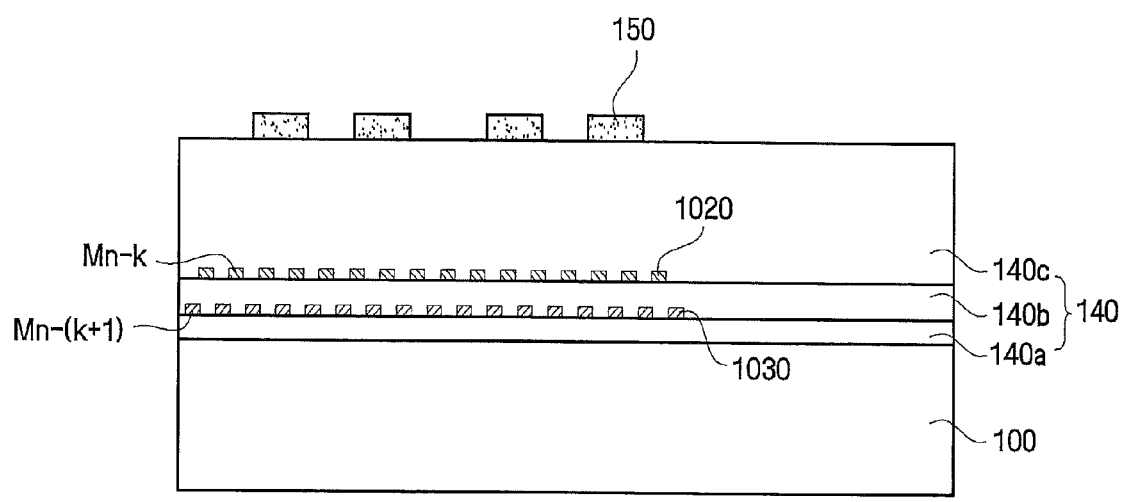
FIG. 10 is a cross-sectional view illustrating an integrated circuit device including passive device shielding according to some further embodiments of the present invention.

FIG. 10 is a cross sectional view illustrating an integrated circuit device including passive device shielding according to yet further embodiments of the present invention. As shown in the embodiments of FIG. 10, a semiconductor substrate 100 has first interlayer dielectric layer 140A formed thereon. A second interlayer dielectric layer 140B is formed on the first interlayer dielectric layer 140A and a third interlayer dielectric layer 140C is formed on the second interlayer dielectric layer 140B. As such, three interlayer dielectric layers 140A, 140B, 140C generally correspond to the interlayer dielectric layer 140.

A flux line generating passive electronic element, shown as an inductor 150, is formed on the third interlayer dielectric layer 140C. A first grounded conductive shield pattern 1030 is formed on the first interlayer dielectric layer 130A in a region below the inductor 150. A second grounded connective shield pattern 1020 is formed on the second interlayer dielectric layer 140B in the region below the inductor 150. The respective conductive shield patterns 1020, 1030 define a complimentary shield pattern. In particular, as shown in the embodiments of FIG. 10, the respective shield patterns 1020, 1030 may be defined by stacked metal layers Mn-k, Mn-(k+1). For example, the layer Mn-(k+1) may be a first metal conductive layer that, in an adjacent active region of the integrated circuit device, serves as a connect layer for connecting to gate electrodes. Similarly, the next metal layer Mn-k may be utilized as a conductor connecting pattern in an active region of an integrated circuit device providing for connections to and between, for example, source and drain regions for devices formed in the active regions.

The respective metal layers Mn-k, Mn-(k+1), may be formed concurrently with formation of the metal conductive patterns utilized in the active regions and on the same interlayer dielectric layer as utilized for formation of the connector region structure within those active regions. Accordingly, as with the dummy gate structure described previously, the metal layers defining a shield structure in FIG. 10 may, in some embodiments of present invention, be readily provided and generated during a common manufacturing fabrication process with the active region devices being formed in the integrated circuit device. The respective first and second grounded conductive shields 1020, 1030 may be metal layers as noted above. As such, first and second metal conductive shield patterns may be provided in the regions below the passive electronic element, which shield patterns may, in some embodiments of the present invention, be grounded, for example, in a central region thereof.

Further embodiments of the present invention will now be described generally with reference to FIG. 2. While FIG. 2 was referred to previously in describing embodiments including a dummy gate structure and a conductor pattern together defining a complimentary shield under the inductor 150, it will be understood that, in other embodiments of the present invention, the isolation region 110, without the inclusion of the dummy gate pattern 111, may likewise define a first shield pattern that is configured to inhibit penetration into the semiconductor substrate 100 of flux lines generated by a passive electronic element, such as the inductor 150. In such embodiments utilizing an isolation region pattern without the inclusion of the dummy gate structure 111, a plurality of conductive elements 130 may still be similarly position between ones of the isolation regions 110 to define a second complimentary shield pattern further configured to inhibit penetration into the substrate 100 of flux lines generated by the inductor 150. Furthermore, in yet other embodiments of the present invention, the dummy gate structure 111 may be formed in the regions between the isolation regions 110 where the conductive elements 130 are shown as positioned in FIG. 2. Thus, the isolation regions 110 may be used in different embodiments of the present invention as a complimentary shield pattern in combination with either conductive elements 130 or a dummy gate structure 111.

Figure 11:
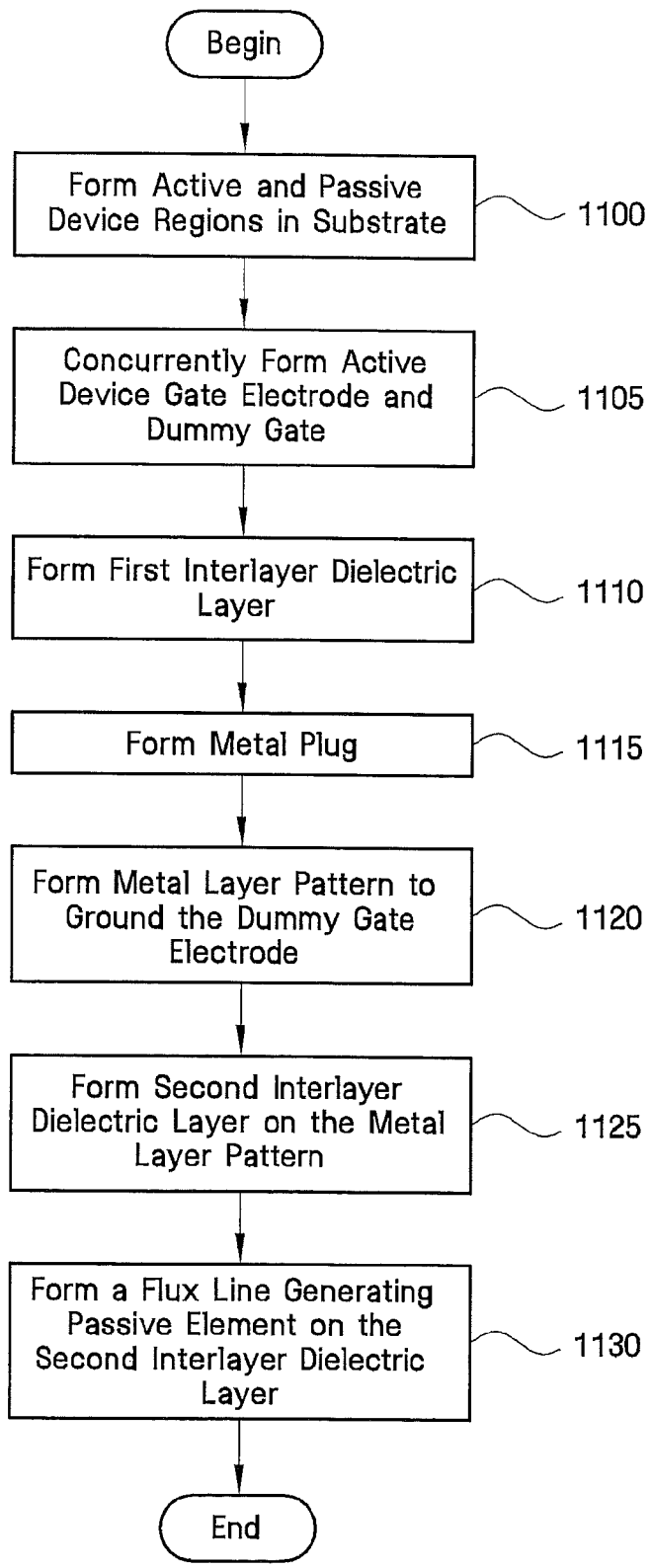
FIG. 11 is a flowchart illustrating operations for forming an integrated circuit device including passive device shielding according to some embodiments of the present invention.

Methods for forming an integrated circuit device according to various embodiments of the present invention will now be described with reference to the flow chart illustration of FIG. 11. As shown in the embodiments of FIG. 11, operations begin by forming an active device region and a passive device region on a semiconductor substrate (Block 1100). A gate electrode of an active device is formed in the active device region and a dummy gate electrode is concurrently formed in the passive device region (Block 1105). A first interlayer dielectric layer is formed on the gate electrode and the dummy gate electrode (Block 1110). A metal plug is formed extending through the first interlayer dielectric and contacting the dummy gate electrode at a central region thereof (Block 1115). A metal layer pattern is formed contacting the metal plug to connect the dummy gate electrode to ground (Block 1120). A second interlayer dielectric layer is formed on the metal layer pattern (Block 1125). Finally, a flux line generating passive electronic element, such as an inductor, is formed on the interlayer dielectric layer over the dummy gate electrode (Block 1130).

Figure 12:
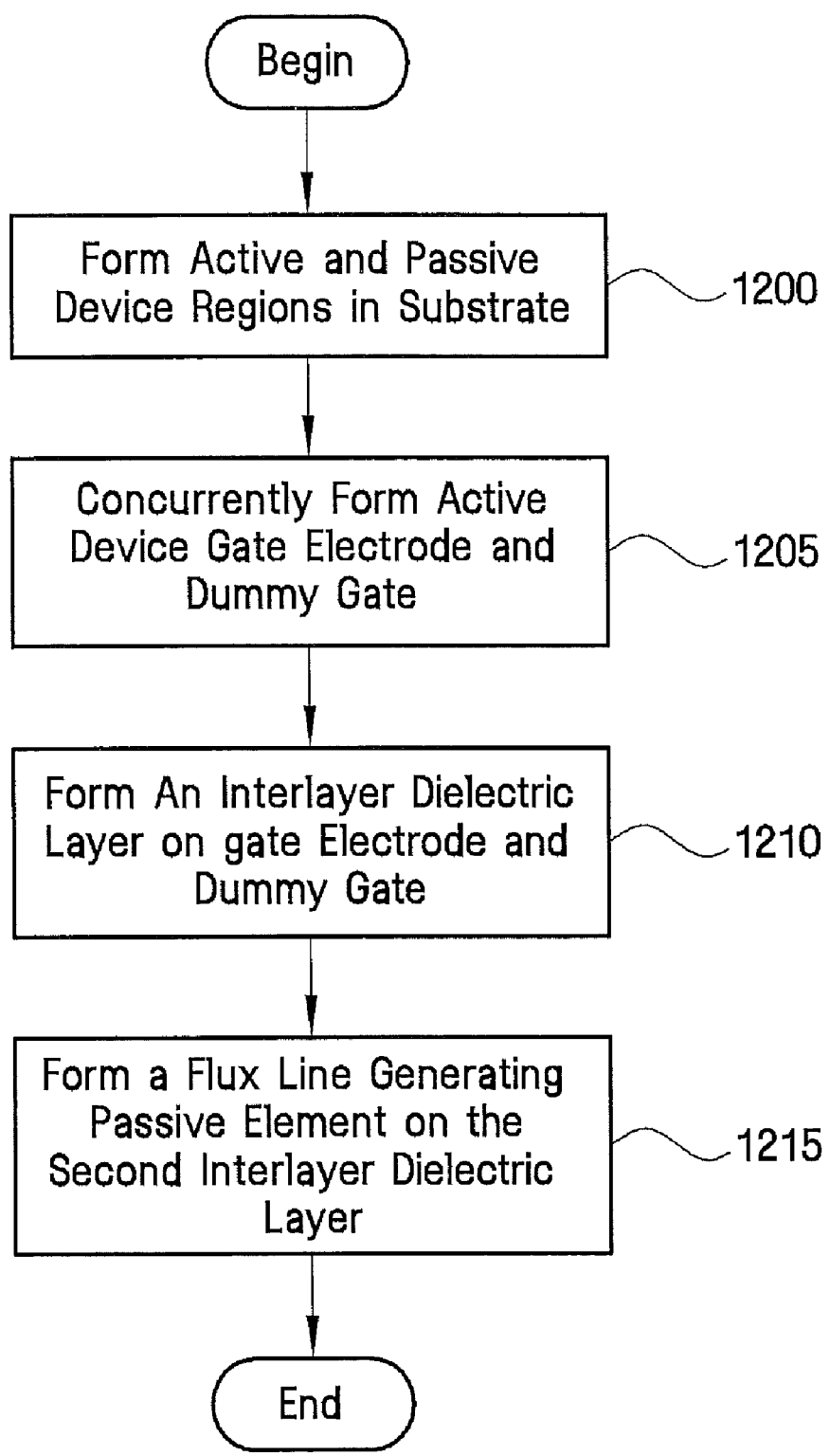
FIG. 12 is a flowchart illustrating operations for forming an integrated circuit device including passive device shielding according to further embodiments of the present invention.

Methods of forming an integrated circuit device according to further embodiments of the present invention will now be described with reference to the flow chart illustration of FIG. 12. As shown in FIG. 12, an active device region and a passive device region are formed in a semiconductor substrate (Block 1200). A gate electrode of an active device is formed in the active device region and a dummy gate electrode structure is concurrently formed on the passive device region (Block 1205). The dummy gate electrode structure includes a plurality of segments. Each segment includes a first longitudinally extending part and a second longitudinally extending part. The second longitudinally extending part extends at an angle from an end of the first longitudinally extending part. Ones of the segments extend at a substantially same angle and are arranged displaced from each other in an adjacent nested relationship. An interlayer dielectric layer is formed on the gate electrode and the dummy gate electrode structure (Block 1210). A flux line generating passive electronic element, such as an inductor or capacitor, is formed on the interlayer dielectric layer over the dummy gate electrode structure (Block 1215).

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. An integrated circuit device, comprising:
 a semiconductor substrate;
 a first interlayer dielectric layer on the semiconductor substrate;
 a second interlayer dielectric layer on the first interlayer dielectric layer;
 a third interlayer dielectric layer on the second interlayer dielectric layer;
 a flux line generating passive electronic element on the third interlayer dielectric layer;
 a first grounded conductive shield pattern on the first interlayer dielectric layer in a region below the passive electronic element; and
 a second grounded conductive shield pattern on the second interlayer dielectric layer in the region below the passive electronic element.

2. The integrated circuit device of claim 1 wherein the first and second grounded conductive shield comprise metal.

3. An integrated circuit device comprising:
 a semiconductor substrate;
 a flux line generating passive electronic element on the semiconductor substrate;
 an isolation region having a plurality of segments in the semiconductor substrate below the passive electronic element defining a first shield pattern that is configured to inhibit penetration into the semiconductor substrate of flux lines generated by the passive electronic element; and
 a plurality of conductive elements positioned between ones of the isolation regions to define a complementary second conductive shield pattern that is configured to inhibit penetration into the semiconductor substrate of flux lines generated by the passive electronic element.

4. The integrated circuit device of claim 3 wherein the plurality of conductive elements comprise a dummy gate structure.

5. The integrated circuit device of claim 3 wherein the plurality of conductive elements comprise a metal silicide pattern.

6. An integrated circuit device comprising:
 a semiconductor substrate;
 a flux line generating passive electronic element on the semiconductor substrate;
 a plurality of dummy gate structures arranged on the semiconductor substrate in a region below the passive electronic element, the plurality of dummy gate structures being displaced from each other and being arranged to inhibit penetration into the semiconductor substrate of flux lines generated by the passive electronic element.

7. The integrated circuit device of claim 6 further comprising:
 an interlayer dielectric layer on the plurality of dummy gate structures;
 a metal layer coupled to ground on the interlayer dielectric layer; and a plurality of conductive contacts extending from the metal layer to the plurality of dummy gate structures to couple the plurality of dummy gate structures to ground through the metal layer.

8. The integrated circuit substrate of claim 7 further comprising a second interlayer dielectric layer on the interlayer dielectric layer on the plurality of gate structures, the second interlayer dielectric layer extending over the plurality of dummy gate structures and wherein the passive electronic element is positioned on the second interlayer dielectric layer.

9. The integrated circuit device of claim 8 further comprising a plurality of isolation regions in the region below the passive electronic element and wherein the dummy gate structures are positioned on the isolation regions to define a first shield.

10. The integrated circuit device of claim 9 further comprising a plurality of conductive regions between the isolation regions configured to define a complementary second shield.

11. The integrated circuit device of claim 10 further comprising a conductive screen extending into the interlayer dielectric layers and defining a perimeter surrounding the passive electronic element, the conductive screen being configured to limit penetration of flux lines generated by the passive electronic element past the perimeter.

12. The integrated circuit device of claim 11 wherein the conductive screen comprises a plurality of columns of conductive elements extending into the interlayer dielectric layers along the perimeter, the columns being displaced from each other and each of the columns including a plurality of electrically coupled conductive elements displaced from each other.

13. The integrated circuit device of claim 10 wherein the plurality of dummy gates comprises a first longitudinally extending part and a second longitudinally extending part, the second longitudinally extending part extending at an angle from an end of the first part and wherein the ones of the dummy gate regions extend at a same angle and are arranged in adjacent nested relationship with the conductive regions therebetween.

14. The integrated circuit device of claim 13 wherein the plurality of dummy gates comprises a plurality of sets of the ones of the plurality of dummy gates arranged in a symmetrical pattern.

15. The integrated circuit device of claim 10 further comprising a metal contact coupled to the plurality of dummy gates in a central region thereof under the passive electronic element, the metal contact connecting the plurality of dummy gates to ground.

16. An integrated circuit device, comprising:
 a semiconductor substrate;
 a first interlayer dielectric layer on the semiconductor substrate;
 a second interlayer dielectric layer on the first interlayer dielectric layer;
 a third interlayer dielectric layer on the second interlayer dielectric layer;
 a flux line generating passive electronic element on the third interlayer dielectric layer;
 a first metal conductive shield pattern on the first interlayer dielectric layer in a region below the passive electronic element; and
 a second metal conductive shield pattern on the second interlayer dielectric layer in the region below the passive electronic element.

* * * * *